(12) United States Patent
Mitsuya

(10) Patent No.: US 9,575,094 B2
(45) Date of Patent: Feb. 21, 2017

(54) CURRENT SENSOR FOR WIRES HAVING DIFFERENT DIAMETERS

(71) Applicant: ALPS ELECTRIC CO., LTD., Tokyo (JP)

(72) Inventor: Shinji Mitsuya, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 134 days.

(21) Appl. No.: 14/018,080

(22) Filed: Sep. 4, 2013

(65) Prior Publication Data
US 2014/0132248 A1    May 15, 2014

(30) Foreign Application Priority Data
Nov. 14, 2012    (JP) ................ 2012-250507

(51) Int. Cl.
    *G01R 15/14*    (2006.01)
    *G01R 15/20*    (2006.01)
(52) U.S. Cl.
    CPC ................ *G01R 15/207* (2013.01)
(58) Field of Classification Search
    CPC .................................................. G01R 15/14
    USPC ................ 324/117 R, 117 H, 127; 702/65
    See application file for complete search history.

(56) References Cited

U.S. PATENT DOCUMENTS

| 5,495,169 | A | * | 2/1996 | Smith ..................... 324/127 |
| 5,583,429 | A | * | 12/1996 | Otaka ..................... 324/127 |
| 6,414,474 | B1 | | 7/2002 | Gohara et al. |
| 6,759,841 | B2 | * | 7/2004 | Goto et al. ............... 324/117 H |
| 7,230,413 | B2 | * | 6/2007 | Zhang et al. ............. 324/117 R |
| 2006/0033487 | A1 | * | 2/2006 | Nagano et al. ............ 324/117 H |
| 2011/0221434 | A1 | * | 9/2011 | Nishiyama et al. .......... 324/252 |
| 2012/0290240 | A1 | * | 11/2012 | Fukui ......................... 702/65 |
| 2013/0099775 | A1 | * | 4/2013 | Mitsuya ..................... 324/126 |
| 2013/0106400 | A1 | * | 5/2013 | Cheng ................. G01R 15/20 324/117 R |
| 2013/0257469 | A1 | * | 10/2013 | Arima .................... 324/756.01 |

FOREIGN PATENT DOCUMENTS

JP    2006-322706    11/2006
WO   WO 2013005450 A1 *   1/2013

* cited by examiner

*Primary Examiner* — Son Le
*Assistant Examiner* — Akm Zakaria
(74) *Attorney, Agent, or Firm* — Beyer Law Group LLP

(57) ABSTRACT

A current sensor includes a casing including a pair of arms and coupling part, multiple magneto-electric transducers arranged on the circumference of a virtual ellipse whose major axis or minor axis extends between the arms, a support disposed obliquely relative to the major axis or the minor axis of the virtual ellipse within an angle formed by the major axis and the minor axis so as to be close to one of the arms when viewed from the center of a wire disposed and fastened between the arms, and a band wound around a circumferential surface of the wire fastened between the arms, part of the band being caught by the support, the wire being fastened by the band such that the central axis or center of the wire is held close to the support.

19 Claims, 9 Drawing Sheets

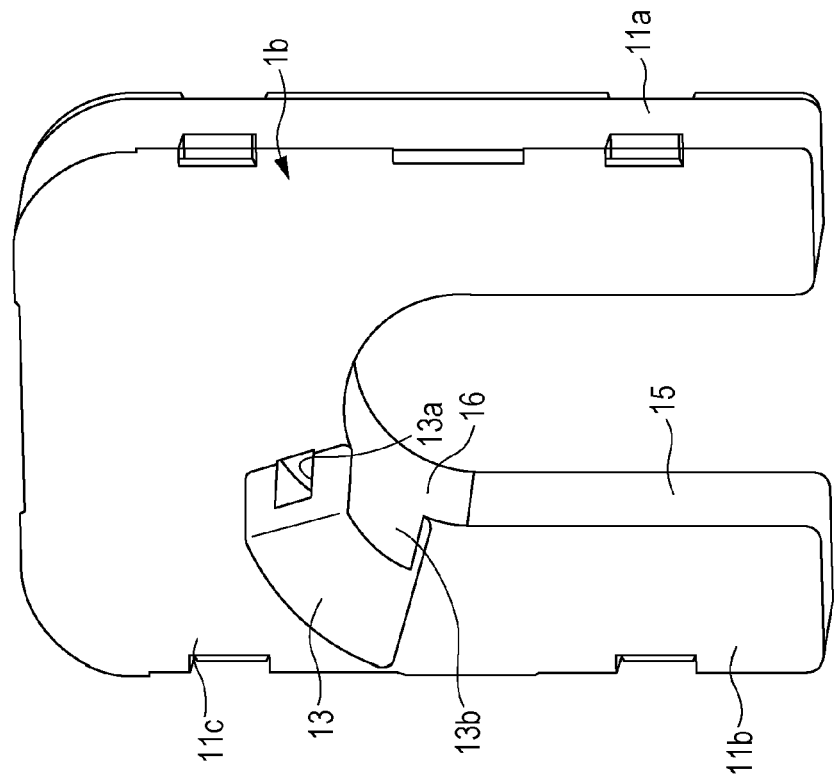
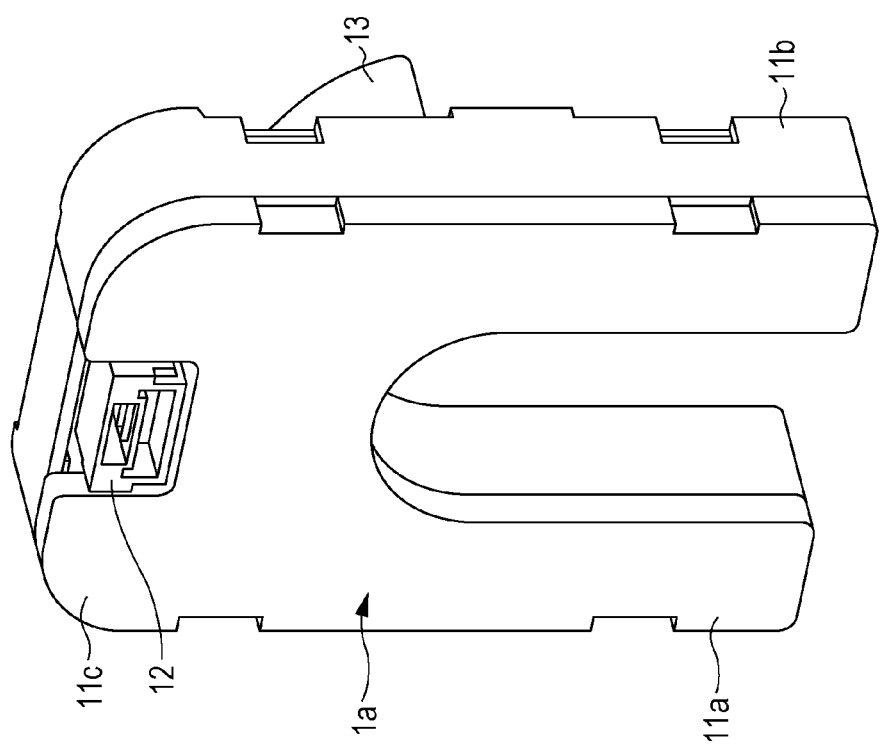

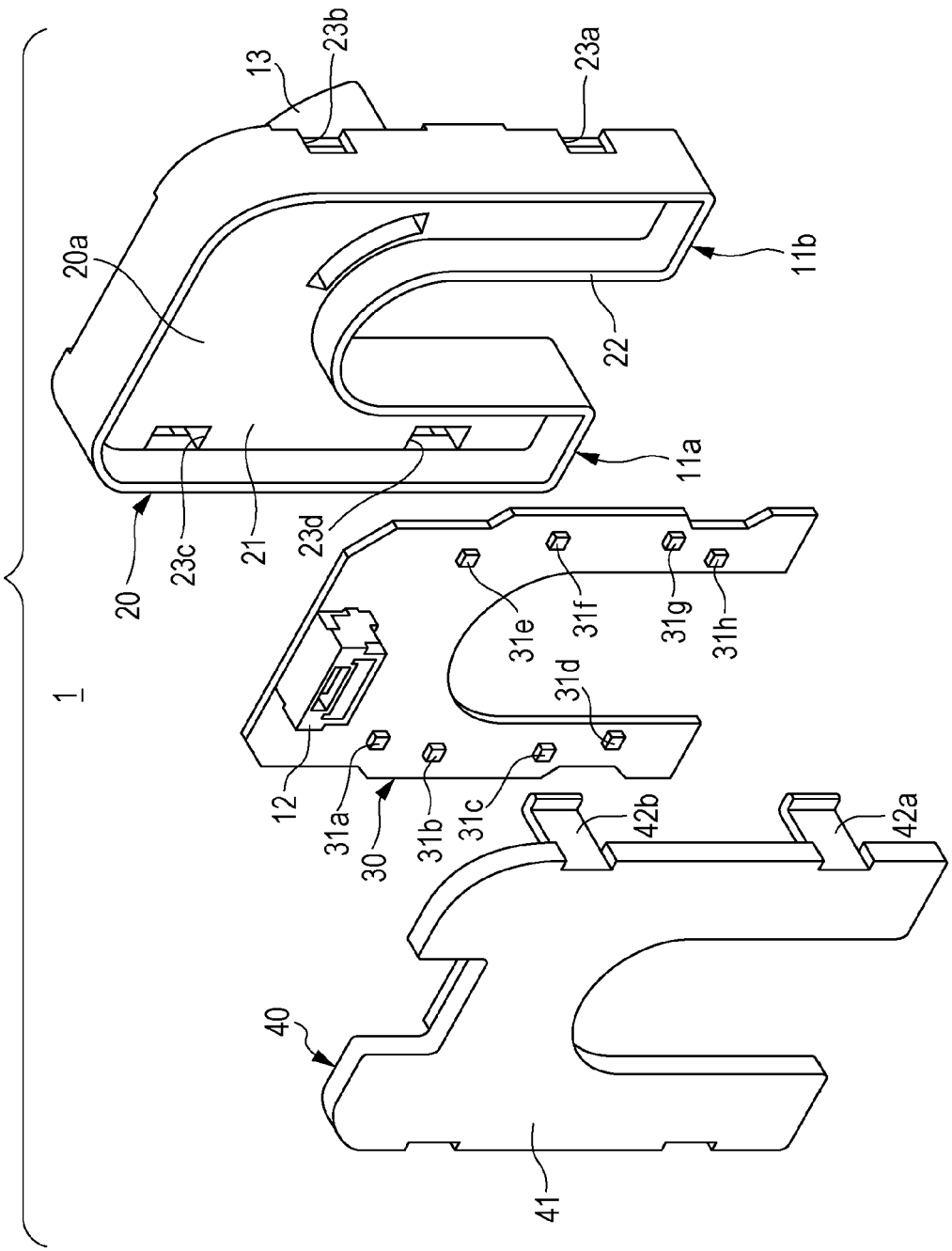

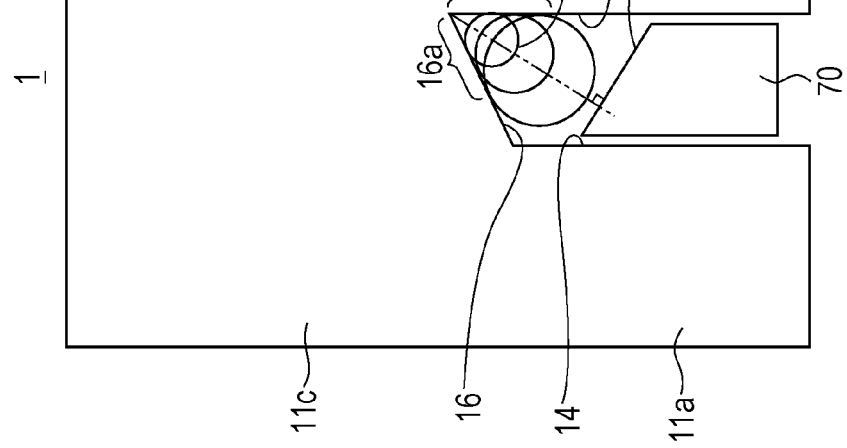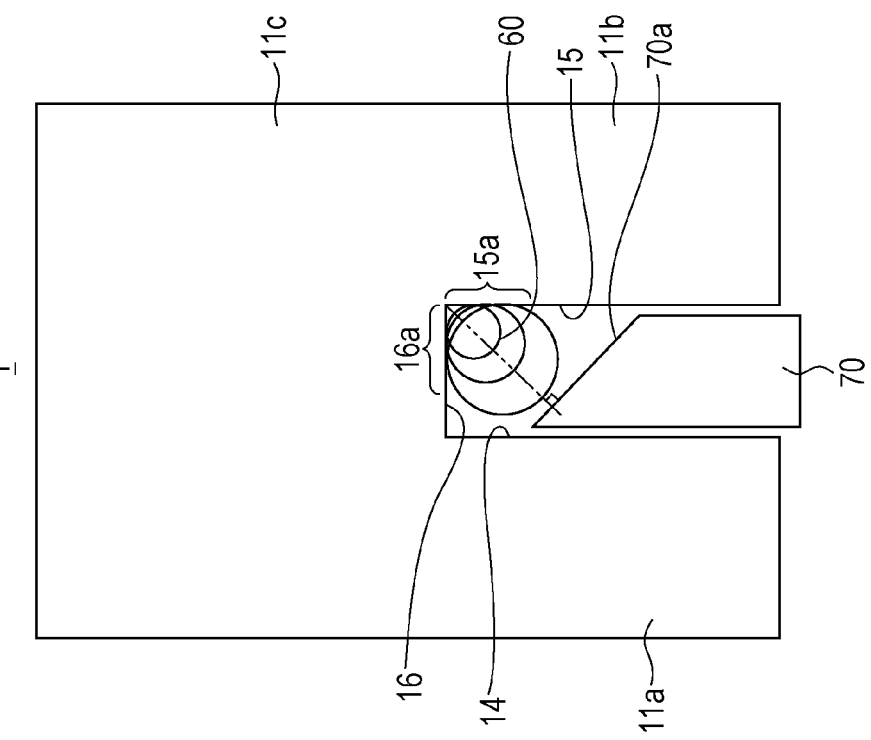

US 9,575,094 B2

CURRENT SENSOR FOR WIRES HAVING DIFFERENT DIAMETERS

CLAIM OF PRIORITY

This application claims benefit of Japanese Patent Application No. 2012-250507 filed on Nov. 14, 2012 hereby incorporated by reference.

BACKGROUND OF THE INVENTION

1. Field of the Invention

The present invention relates to current sensors for measuring target current flowing through an electric wire (hereinafter, referred to as a "wire"), and in particular, relates to a current sensor including a magnetic sensing element.

2. Description of the Related Art

In the field of motor drive technology for electric vehicles and hybrid cars, relatively large current is used, and therefore current sensors capable of measuring such large current in a contactless manner are required. Such current sensors recently developed include a current sensor that allows magnetic sensor elements to detect a change in magnetic field caused by target current (refer to Japanese Unexamined Patent Application Publication No. 2006-322706, for example).

The current sensor disclosed in Japanese Unexamined Patent Application Publication No. 2006-322706 includes a substrate with a slit having a circular end located in middle part of the substrate and four magnetic impedance elements arranged apart so as to surround a wire extending through the circular end of the slit. In the current sensor, a target current is determined on the basis of the sum of values of signals output from the magnetic impedance elements, the values varying depending on an induced magnetic field from the target current flowing through the wire extending through the circular end of the slit.

As an installation position of the current sensor is displaced relative to a wire, a magnetic flux density at the position of the sensor significantly changes. Accordingly, when the installation position of the current sensor including the magnetic impedance elements is displaced relative to the wire, the output of the sensor significantly fluctuates. The current sensor therefore has to be securely fixed to the wire. The current sensor disclosed in Japanese Unexamined Patent Application Publication No. 2006-322706 is positioned and fixed by pressing the wire against an inner surface of the circular end of the slit.

In such a structure in which a wire is pressed against a casing (or an inner surface of a circular end of a slit) as in the current sensor disclosed in Japanese Unexamined Patent Application Publication No. 2006-322706, the centers of wires having different diameters differ in position from one another when fixed. Unfortunately, an output may fluctuate as described above.

SUMMARY OF THE INVENTION

The present invention provides a current sensor capable of preventing a fluctuation in output caused by displacement of a wire depending on diameter and supporting various wire diameters.

According to an aspect of the invention, a current sensor includes a casing including a pair of arms and coupling part coupling the arms, multiple magneto-electric transducers accommodated in the casing, the magneto-electric transducers being arranged on the circumference of a virtual ellipse having a major axis and a minor axis, the major axis or the minor axis extending between the arms, a support disposed obliquely relative to the major axis or the minor axis extending between the arms so as to be close to one of the arms when viewed from the center of a wire disposed and fastened between the arms, and a band wound around a circumferential surface of the wire fastened between the arms, part of the band being caught by the support, the wire being fastened by the band such that the center of the wire is held close to the support.

In such a configuration, when a wire through which target current flows is fastened on the support by the band while the wire is disposed between the arms, the wire is held close to one of the arms of the current sensor. Accordingly, when any of various wires having different diameters is fastened by the band, the center of the wire is displaced obliquely relative to the major axis or the minor axis of the virtual ellipse. Consequently, a change in sensitivity of the magneto-electric transducers, arranged on the circumference of the virtual ellipse, caused by displacement of the wire in the direction along the major axis of the virtual ellipse and that caused by displacement of the wire in the direction along the minor axis thereof are canceled out. Thus, a change in sensitivity caused by displacement depending on wire diameter can be minimized.

In this current sensor according to this aspect, the support may support the wire such that the center of the wire is located in a line extending in a direction in which a change in sensitivity caused by displacement of the wire is relatively smaller than that caused by displacement of the wire in the direction along the major axis or the minor axis of the virtual ellipse.

Accordingly, if any of wires having various diameters is fastened, the center of the wire is located in the line extending in the direction in which the sensitivity of the current sensor is least likely to change. Consequently, a change in sensitivity can be reduced, thus improving the accuracy of measurement of target current flowing through the wire.

In the current sensor according to the aspect, the support may be disposed in a direction at 45° relative to the major axis or the minor axis of the virtual ellipse extending between the arms such that the support is close to one of the arms, the major axis or the minor axis being at 0°.

Consequently, a change in sensitivity of the current sensor can be reduced most effectively in displacement of the center of any of wires having different diameters upon fastening the wire.

According to another aspect of the invention, a current sensor includes a casing including a pair of arms and coupling part coupling the arms, multiple magneto-electric transducers accommodated in the casing, the magneto-electric transducers being arranged on the circumference of a virtual ellipse having a major axis and a minor axis, the major axis or the minor axis extending between the arms, and a fastening member disposed between the arms, wherein the casing includes a first wire supporting portion disposed in an inner wall of one of the arms and a second wire supporting portion disposed in an inner wall of the coupling part, and wherein the fastening member has a bevel inclined from one of the arms to the other arm.

In such a configuration, when any of various wires having different diameters is fastened by the band, the center of the wire is displaced obliquely relative to the major axis or the minor axis of the virtual ellipse. Consequently, a change in sensitivity of the magneto-electric transducers, arranged on the circumference of the virtual ellipse, caused by displacement of the wire in the direction along the major axis of the virtual ellipse and that caused by displacement of the wire in the direction along the minor axis thereof are canceled out. Thus, a change in sensitivity caused by displacement depending on wire diameter can be minimized.

In this current sensor according to this aspect, preferably, the first wire supporting portion, the second wire supporting portion, and the bevel fasten a wire such that the center of the wire is located in a line extending in a direction in which a change in sensitivity caused by displacement of the wire is relatively smaller than that caused by displacement in the direction along the major axis or the minor axis of the virtual ellipse.

Accordingly, if any of wires having various diameters is fastened, the center of the wire is located in the line extending in the direction in which the sensitivity of the current sensor is least likely to change. Consequently, a change in sensitivity can be reduced, thus improving the accuracy of measurement of target current flowing through the wire.

In the current sensor according to the aspect, preferably, the first wire supporting portion, the second wire supporting portion, and the bevel are arranged in a direction at 45° relative to the direction along the major axis or the minor axis of the virtual ellipse extending between the arms such that the portions and the bevel are close to one of the arms, the major axis or the minor axis being at 0°.

Consequently, a change in sensitivity of the current sensor can be reduced most effectively in displacement of the center of any of wires having different diameters upon fastening the wire.

BRIEF DESCRIPTION OF THE DRAWINGS

FIGS. 1A and 1B are perspective views of a current sensor according to an embodiment;

FIG. 2 is an exploded perspective view of the current sensor according to the embodiment;

FIGS. 9A and 9B are schematic diagrams illustrating modifications in each of which a wire is displaced obliquely.

DESCRIPTION OF THE PREFERRED EMBODIMENTS

Figure 3:
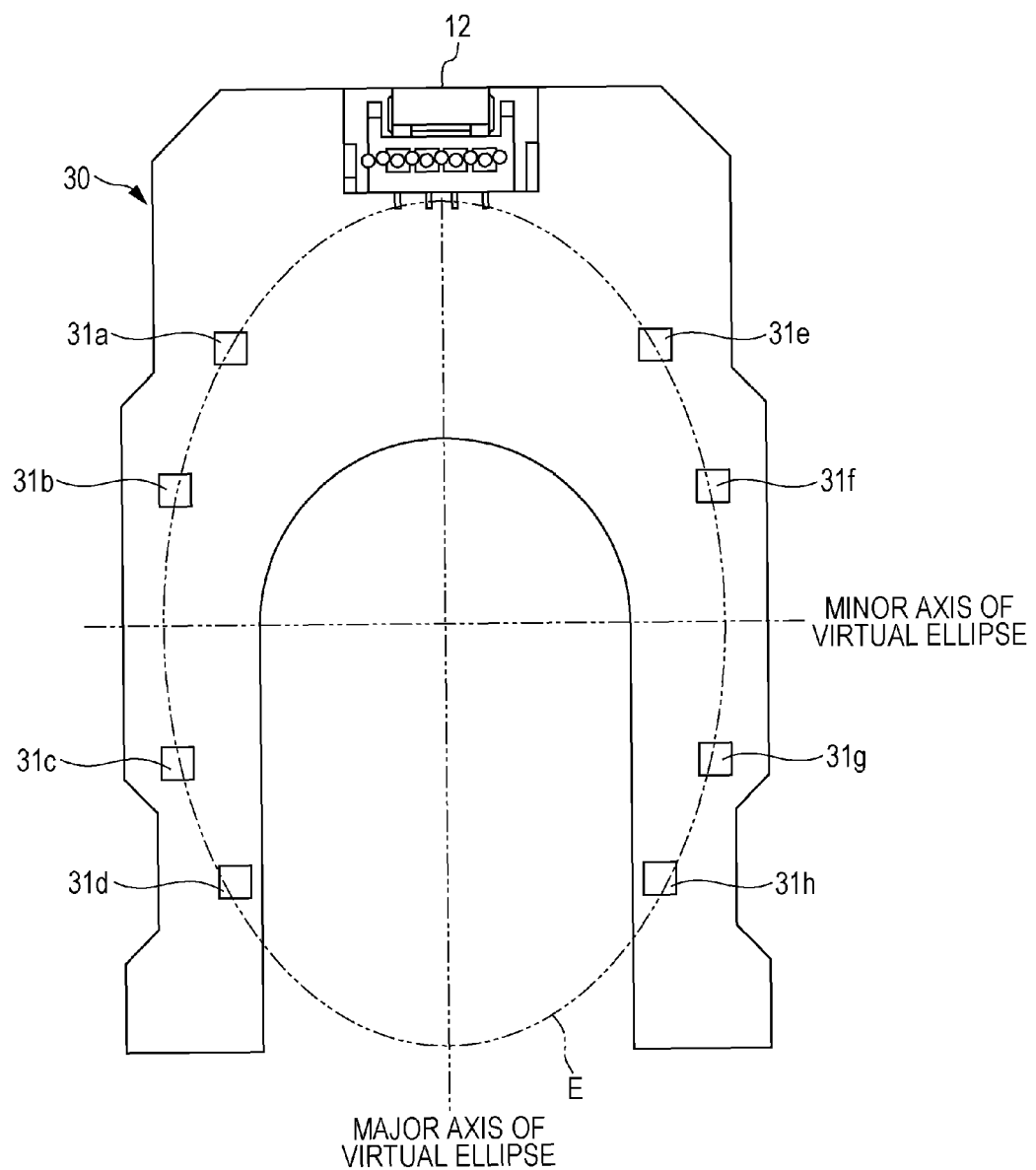
FIG. 3 is a schematic diagram illustrating elliptical arrangement of magneto-electric transducers.

An embodiment of the invention will be described in detail below with reference to the accompanying drawings.

FIGS. 1A and 1B are perspective views of a current sensor according to the present embodiment. FIG. 2 is an exploded perspective view of the current sensor illustrated in FIGS. 1A and 1B. FIG. 1A is a perspective view of the current sensor as viewed from a connector side (hereinafter, referred to as a first surface). FIG. 1B is a perspective view of the current sensor viewed from the opposite side (hereinafter, referred to as a second surface) of the current sensor from that illustrated in FIG. 1A.

The current sensor, indicated at 1, according to the embodiment includes a U-shaped casing that includes a pair of arms 11a and 11b extending in the same direction and coupling part 11c which corresponds to the base of the "U" shape and couples proximal ends of the arms 11a and 11b. The current sensor 1 has a first surface 1a in which a connector 12 for connection to a distribution cable is disposed near an upper end of the coupling part 11c of the casing (refer to FIG. 1A), provided that distal ends of the arms 11a and 11b correspond to a lower end of the casing. The current sensor 1 has a second surface 1b on which a support 13 having a band hole 13a for wire fastening is disposed at the intersection between the arm 11b and the coupling part 11c (refer to FIG. 1B). The position of the intersection at which the support 13 is disposed will be described later.

As illustrated in FIG. 2, the U-shaped casing of the current sensor 1 includes a casing portion 20 having a receiving space 20a corresponding to the U-shaped contour, a sensor substrate 30 disposed in the receiving space 20a of the casing portion 20, and a lid 40 that closes an opening (corresponding to the first surface 1a) of the receiving space 20a of the casing portion 20. The casing portion 20 includes an outer wall 21 defining the second surface 1b and a side wall 22 extending perpendicularly from an outer edge of the outer wall 21 by a distance corresponding to the thickness of the receiving space 20a. The receiving space 20a is defined by the outer wall 21 and the side wall 22 of the casing portion 20 and the lid 40. The support 13 is disposed on the outer wall 21 (the second surface 1b) of the casing portion 20. The outer wall 21 has a plurality of engagement holes 23a to 23d for attachment of the lid 40. The sensor substrate 30 is provided with a plurality of magneto-electric transducers 31 (31a to 31h) configured to output a signal based on an induced magnetic field around a wire through which target current flows. The sensor substrate 30 is further provided with the connector 12 through which output signals of the magneto-electric transducers 31 are taken to the outside of the sensor, the connector 12 being placed on upper end part of the sensor substrate 30. A distribution cord is connected to the connector 12, thus enabling the output signals based on target current flowing through the wire to be taken to the outside of the current sensor 1. The lid 40 includes an outer wall 41 defining the first surface 1a and a plurality of engagement lugs 42a and 42b (and engagement lugs 42c and 42d hidden by the outer wall 41) arranged so as to correspond to the engagement holes 23a to 23d of the casing portion 20, respectively. The lid 40 is attached and fixed to the casing portion 20 by inserting the engagement lugs 42a to 42d of the lid 40 into the engagement holes 23a to 23d arranged in the outer wall 21 of the casing portion 20, respectively.

FIG. 3 is a plan view of the sensor substrate 30. The sensor substrate 30 is U-shaped so as to correspond to the shape of the receiving space 20a in plan view such that the sensor substrate 30 can be fitted in the receiving space 20a of the casing portion 20. The sensor substrate 30 extends over an area corresponding to the arms 11a and 11b and the coupling part 11c of the current sensor 1. The magneto-electric transducers 31 are arranged in this area. In the current sensor 1 according to the embodiment, eight magneto-electric transducers 31a to 31h are arranged on the circumference of a virtual ellipse E disposed over the arms 11a and 11b and the coupling part 11c. The major axis of the virtual ellipse E extends between the arms 11a and 11b. Referring to FIG. 3, the magneto-electric transducers 31a to 31h are arranged on the circumference of the virtual ellipse E such that the major axis of the virtual ellipse E coincides with an intermediate line between the arms 11a and 11b.

The position of the support 13 may be defined as follows. It is assumed that a wire is guided and fastened between the arms 11a and 11b, provided that the magneto-electric transducers 31a to 31h are arranged on the circumference of the virtual ellipse E and the major axis of the virtual ellipse E extends between the arms 11a and 11b. When viewed from the center of the wire fastened between the arms 11a and 11b, the support 13 is disposed obliquely relative to the major axis extending between the arms 11a and 11b so as to be close to the arm 11b. Assuming that the minor axis of the virtual ellipse E extends between the arms 11a and 11b, when viewed from the center of the wire fastened between the arms 11a and 11b, the support 13 is disposed obliquely relative to the minor axis extending between the arms 11a and 11b so as to be close to the arm 11b.

Figure 4:
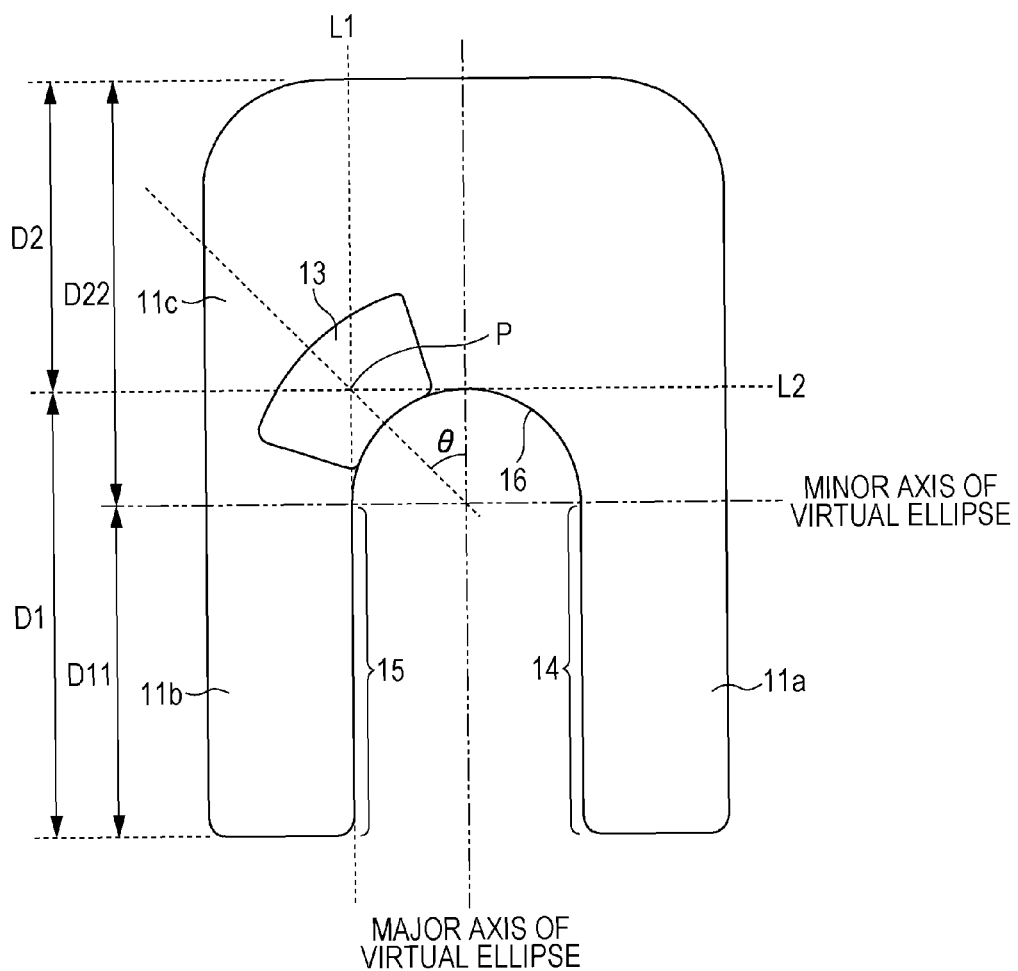
FIG. 4 is a schematic plan view of a second surface of the current sensor illustrated in FIGS. 1A and 1B.

Furthermore, the position of the support 13 may be defined as follows. As described above, the support 13 is disposed at the intersection between the arm 11b and the coupling part 11c on the outer wall 21 (the second surface 1b) of the current sensor 1. As illustrated in FIG. 4, let D1 denote a range corresponding to the arm 11b and let D2 denote a range corresponding to the coupling part 11c in a direction (hereinafter, also referred to as the "major axis direction") along the major axis of the virtual ellipse E. The center of the intersection coincides with a point P of intersection between a line L1 extending along an inner wall of the arm 11b in the major axis direction and a line L2 extending along a lower surface of the coupling part 11c in a direction (hereinafter, also referred to as the "minor axis direction") along the minor axis of the virtual ellipse E. In the case where an inner wall 16 which is semicircular in plan view is continuous with ends of straight inner walls 14 and 15 of the arms 11a and 11b as in the embodiment, the arms 11a and 11b and the coupling part 11c can be defined such that a range D11 including the straight inner walls 14 and 15 corresponds to the arms 11a and 11b and a range D22 including the semicircular inner wall 16 corresponds to the coupling part 11c. In this case, the position of the support 13 may be defined such that the support 13 is placed along the semicircular inner wall 16 of the coupling part 11c so as to be close to the arm 11b.

Figure 5:
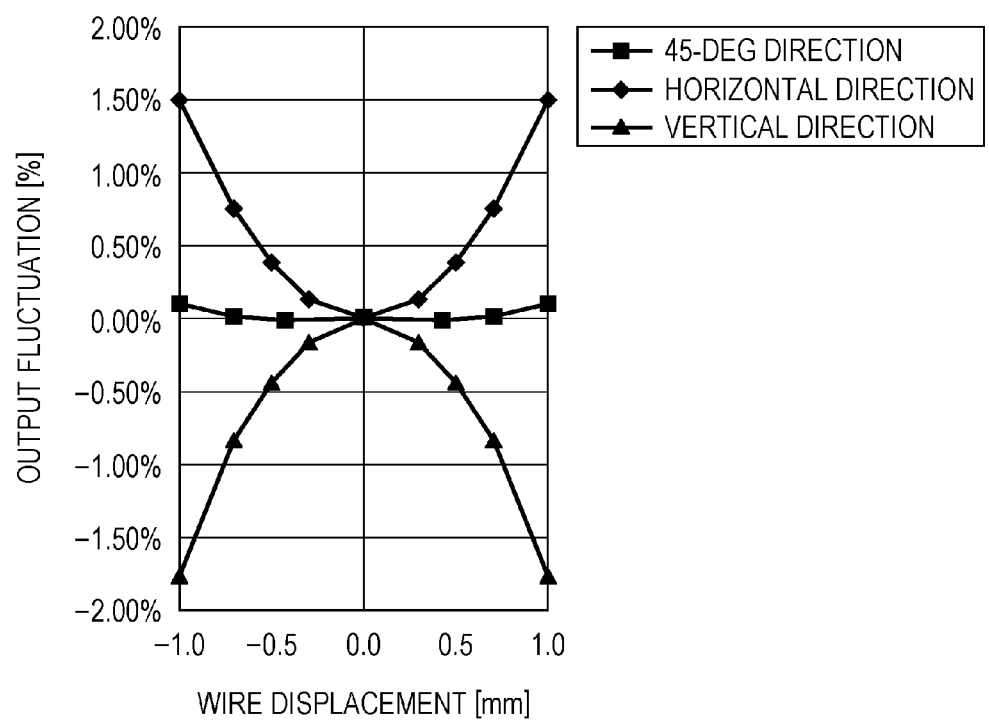
FIG. 5 is a graph illustrating the relationship between a displacement of a wire and a fluctuation in output.

FIG. 5 is a graph illustrating the relationship between a displacement of a wire and a fluctuation in output of the current sensor 1, the relationship being based on data obtained from examination by the inventor. The magneto-electric transducers 31a to 31h were arranged on the circumference of the virtual ellipse E, the major axis direction of the virtual ellipse E was set to the vertical direction, the minor axis direction was set to the horizontal direction, and the major axis of the virtual ellipse E was set to 0° (refer to FIG. 3). A curve indicated by solid triangles denotes output fluctuations in displacement of the wire (or the center of the wire) in the vertical direction. The output fluctuated as indicated by such a parabola which opens down and whose highest point coincides with a displacement of 0. A curve indicated by small solid rectangles denotes output fluctuations in displacement of the wire (or the center of the wire) in the horizontal direction. The output fluctuated as indicated by such a parabola which opens up and whose lowest point coincides with a displacement of 0. The graph demonstrates that the output significantly fluctuated due to displacement of the wire (the center of the wire) in each of the vertical and horizontal directions. A curve indicated by large solid rectangles denotes output fluctuations in displacement of the wire (the center of the wire) in a 45° (or 45-deg) direction. It has been determined that the output fluctuations in displacement of the wire (the center of the wire) in the 45° direction were significantly smaller than those in the vertical direction (or the major axis direction) or the horizontal direction (or the minor axis direction). The following reason is considered: when the wire (or the center of the wire) is displaced in the 45° direction, serving as the intermediate direction between the vertical direction and the horizontal direction, the directions of change in sensitivity are opposite to each other, so that sensitivity changes are canceled out each other, leading to a smaller change in sensitivity than that in displacement in the vertical or horizontal direction.

The structure of the support 13 will be described in detail below. For convenience of explanation, it is assumed that the range D1 corresponds to the arms 11a and 11b and the range D2 corresponds to the coupling part 11c in the major axis direction of the virtual ellipse E (refer to FIG. 4). As illustrated in FIG. 1B, the inner wall 15 (and the inner wall 14) of the arm 11b (and the arm 11a) is flat and the inner wall 16 of the coupling part 11c is a curved surface that is semicircular in plan view and is continuous with the ends of the flat inner walls 14 and 15 of the arms 11a and 11b. The support 13 is placed on the second surface 1b so as to be at 45°, indicated by $\theta$ in FIG. 4, relative to the major axis of the virtual ellipse E extending through the middle of the semicircular curved surface of the coupling part 11c. The support 13 has the band hole 13a extending therethrough from one side wall of the support 13 to the other side wall along the semicircular inner wall 16 of the coupling part 11c. The band hole 13a may have any structure as long as a band can be caught by the band hole 13a. It is unnecessary that the band hole 13a be a through-hole. The support 13 further has an abutment surface 13b that is continuous and flush with the inner wall 16, serving as a casing-side wire abutment surface, of the coupling part 11c. Since the abutment surface 13b of the support 13 is added to increase the casing-side wire abutment surface in a direction along the axis of the wire, the increased abutment surface enables the wire to be stably and tightly fastened when the wire is fastened while being pressed against the support 13 by a band, which will be described later. Although the wire is pressed against the inner wall 16 of the coupling part 11c (and the abutment surface 13b of the support 13), the diameter of the semicircular curved surface of the inner wall 16 is set to be greater than an expected maximum diameter of the wire. This results in a reduction in distance in which the center of the wire is displaced depending on wire diameter, leading to a smaller change in sensitivity.

Figure 6:
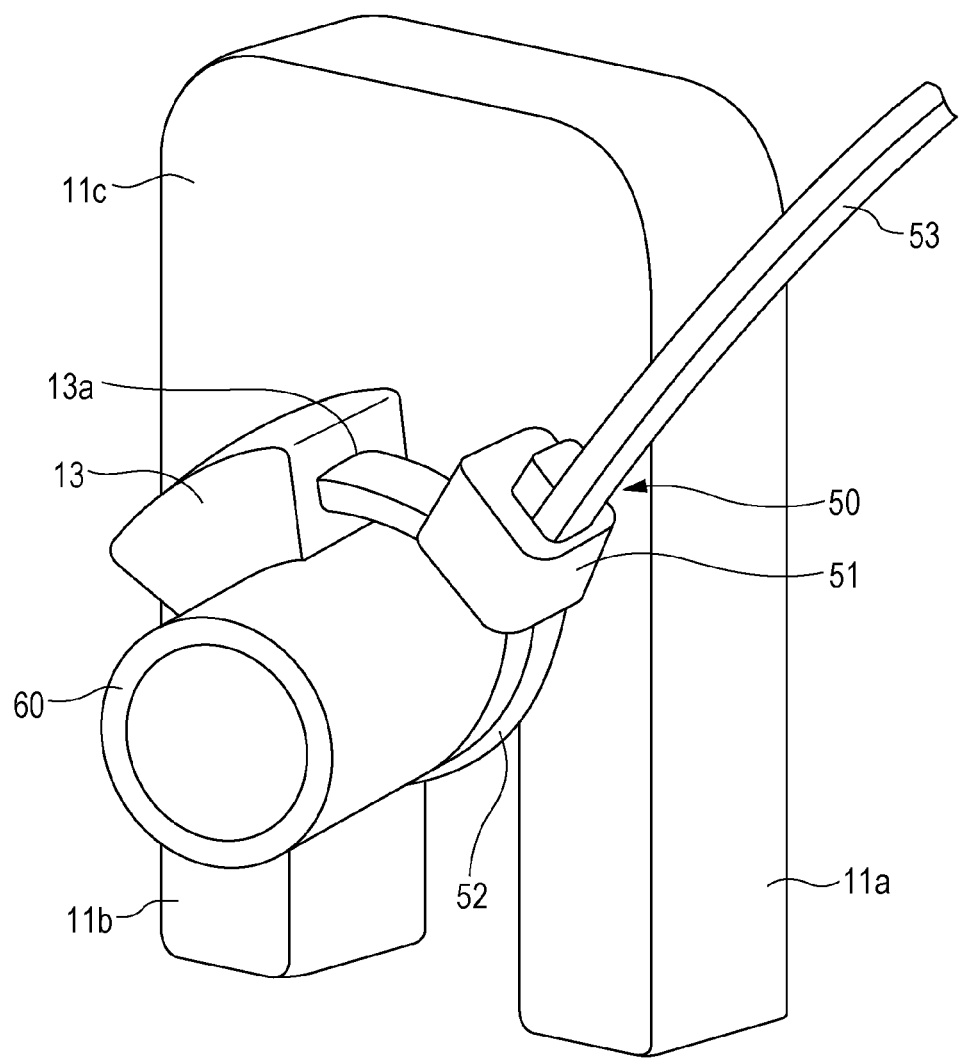
FIG. 6 is a diagram illustrating a state in which a wire is disposed between arms of the current sensor.

FIG. 6 illustrates a state in which a wire is guided between the arms of the current sensor 1. In this example, a binding band 50 is used to fasten a wire 60 such that the central axis or center of the wire 60 is held close to the support 13. The binding band 50 includes a head portion 51 provided with a lock mechanism, a band portion 52 connected to the head portion 51 at one end, and a tail portion 53 extending from the other end of the band portion 52. The tail portion 53 is inserted into the band hole 13a of the support 13, the band portion 52 extending through the band hole 13a is wound around a circumferential surface of the wire 60 pressed against the inner wall 16 of the coupling part 11c and the abutment surface 13b of the support 13, and the tail portion 53 is inserted into the head portion 51. When the tail portion 53 is pulled hard, the band portion 52 is tightened against the wire 60 at the band hole 13a of the support 13 as a base point such that the wire 60 (or the center of the wire) is held close to the support 13. Since the lock mechanism of the head portion 51 acts so as to prevent the band portion 52 from being loosened, the wire 60 is fastened such that the wire 60 (the center of the wire) is held close to the support 13.

The embodiment utilizes the fact that fluctuations in sensitivity of the current sensor 1 in displacement of the center of a wire in the direction along the major axis of the virtual ellipse E are opposite to those in the direction along the minor axis thereof in the arrangement of the magneto-electric transducers 31a to 31h on the circumference of the virtual ellipse E. A change in sensitivity can be minimized in displacement of the center of the wire in a direction oblique (or at an angle) relative to the major axis of the virtual ellipse E.

According to the embodiment, the wire 60 is pulled obliquely (within an angle formed by the major axis and the minor axis of the virtual ellipse E) and is fastened using the support 13 and the band portion 52, so that the position of the fastened wire 60 is displaced obliquely depending on outside diameter. If a wire 60 having various diameters is attached, a change in sensitivity can be minimized Thus, target current flowing through the wire 60 can be accurately measured.

The inventor made three current sensors with different arrangements of the eight magneto-electric transducers 31a to 31h, included in the current sensor 1, on the circumferences of virtual ellipses and examined the relationship between a displacement of a wire and the magneto-electric transducers 31a to 31h in each of the three current sensors. The result of examination by the inventor will be described below.

Figure 7A:
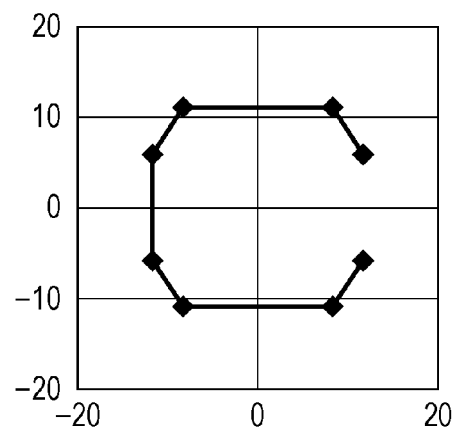
FIGS. 7A to 7C are diagrams illustrating three arrangements of magneto-electric transducers used in simulation.
Figure 7B:
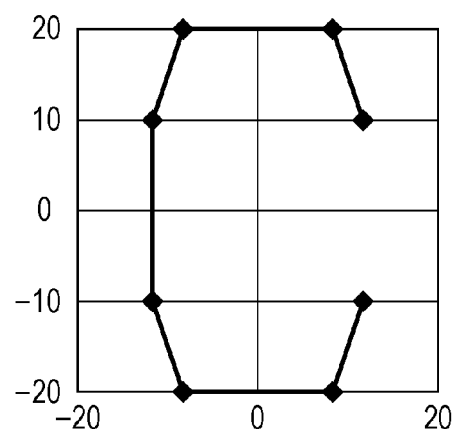
Figure 7C:
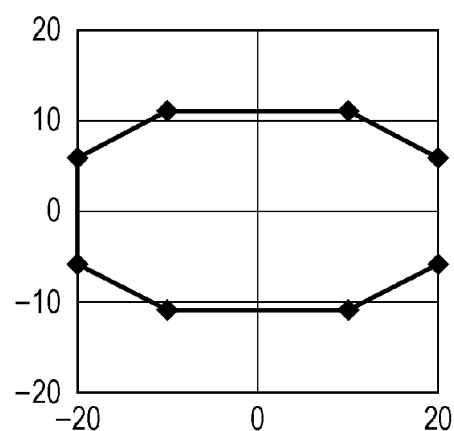
Figure 8A:
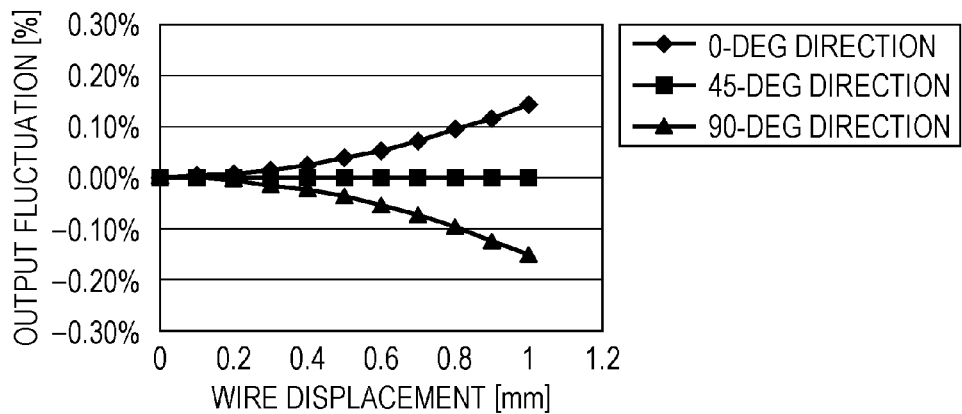
FIGS. 8A to 8C are graphs illustrating results of simulation of wire displacements and output fluctuations in the arrangements of FIGS. 7A to 7C.
Figure 8B:
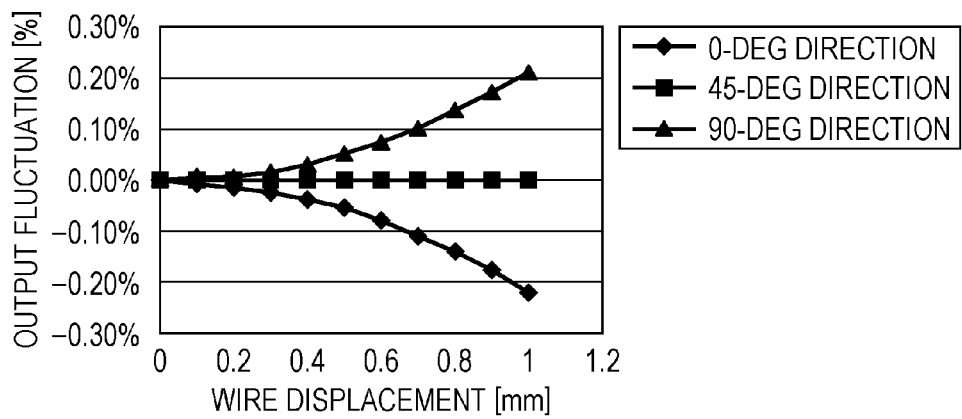
Figure 8C:
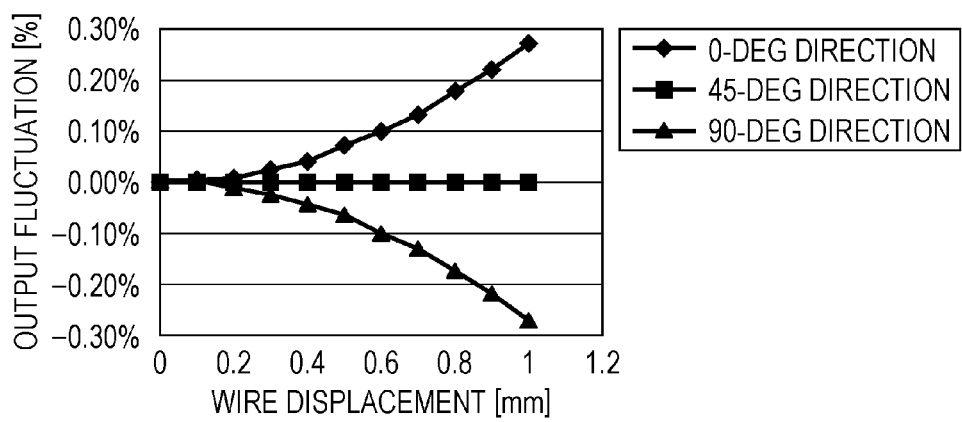

FIGS. 7A and 7B illustrate cases of arrangements of the magneto-electric transducers 31a to 31h on the circumferences of two different virtual ellipses oriented vertically. FIG. 7C illustrates a case of arrangement of the magneto-electric transducers 31a to 31h on the circumference of a virtual ellipse oriented horizontally. FIGS. 8A to 8C illustrate output fluctuations (sensitivity changes) of the current sensors in displacement of the wire (the center of the wire) in a 0° (0-deg) direction (along a vertical axis), a 45° (45-deg) direction, and a 90° (90-deg) direction (along a horizontal axis) in the elliptical arrangements of FIGS. 7A to 7C, respectively. As a result of simulation, the angle at which the sensitivity change was minimized was 45°. This result reveals that the displacement of the wire in the 45° direction in the elliptical arrangement leads to the smallest sensitivity change. If the number of transducers is small and the shape of transducer arrangement approximates a circle, the influence of angle of transducer arrangement may be enhanced. The angle at which the smallest sensitivity change is achieved may be shifted from 45° depending on the positions of arranged transducers.

Although the wire 60 is pulled obliquely and fastened using the support 13 disposed on the outer wall 21, serving as the second surface 1b, of the casing portion 20 and the binding band 50 in the above description, a mechanism for allowing oblique wire displacement based on wire diameter is not limited to the mechanism including the support 13 and the binding band 50.

FIG. 9A illustrates a modification of the embodiment. According to the modification, the inner walls 14 and 15 of the arms 11a and 11b are flat surfaces parallel to the major axis of the virtual ellipse and the inner wall 16 of the coupling part 11c is a flat surface perpendicular to the inner walls 14 and 15. The inner wall 15 of at least the one arm 11b perpendicularly intersects the inner wall 16 of the coupling part 11c. The inner wall 15 of the one arm 11b includes a first wire supporting portion 15a, serving as a flat abutment surface, near the intersection of the inner walls 15 and 16. The inner wall 16 of the coupling part 11c includes a second wire supporting portion 16a, serving as a flat abutment surface, near the intersection. In addition, a fastening member 70 configured to fasten the wire 60 is inserted through an opening between the arms 11a and 11b. The fastening member 70 has a bevel 70a at one end, serving as a leading end during insertion. The bevel 70a is inclined downward from the one arm 11a to the other arm 11b. The thickness (diameter) of the fastening member 70 is slightly smaller than the spacing between the arms 11a and 11b. The inner walls 14 and 15 of the arms 11a and 11b function to guide the fastening member 70. The fastening member 70 can be configured to be urged toward the coupling part 11c by an elastic member. Accordingly, the first wire supporting portion 15a, the second wire supporting portion 16a, and the bevel 70a may fasten the wire such that the center of the wire is located in a line extending in a direction in which a change in sensitivity caused by displacement of the wire is smaller than that in the direction along the major axis or the minor axis of the virtual ellipse.

Such a configuration also allows the center of any of various wires having different diameters to be displaced obliquely relative to the major axis or the minor axis of the virtual ellipse when the wire is fastened by the band. Consequently, a change in sensitivity of the multiple magneto-electric transducers arranged on the circumference of the virtual ellipse caused by displacement of the wire in the major axis direction and that caused by displacement of the wire in the minor axis direction are canceled out, so that a change in sensitivity caused by displacement depending on wire diameter can be minimized.

When the fastening member 70 is pressed toward the coupling part 11c, the bevel 70a presses the wire 60 toward the intersection of the first wire supporting portion 15a and the second wire supporting portion 16a. In other words, a force acts which presses the wire 60 in a direction at 45° relative to the direction along the major axis (or the minor axis) of the virtual ellipse. If the diameter of the wire 60 varies, a force similarly acts which presses the wire in the direction at 45° relative to the major axis direction (or the minor axis direction), so that the center of the wire 60 is displaced in the direction at 45°. Thus, a change in sensitivity of the current sensor 1 can be minimized.

FIG. 9B illustrates another modification of the embodiment. According to this modification, the inner wall 15 of the arm 11b and the inner wall 16 of the coupling part 11c intersect at an acute angle smaller than 90°. Referring to FIG. 9B, the acute angle of intersection is formed by inclining the inner wall 16 of the coupling part 11c downward from the arm 11b to the arm 11a. The inner wall 15 of the arm 11b has a first wire supporting portion 15a, serving as a flat abutment surface, near the intersection. The inner wall 16 of the coupling part 11c has a second wire supporting portion 16a, serving as a flat abutment surface, near the intersection. A fastening member 70 configured to fasten the wire 60 is inserted through the opening between the arms 11a and 11b. In the modification, since the first wire supporting portion 15a and the second wire supporting portion 16a form an acute angle, the wire 60 pressed by the fastening member 70 is displaced slightly upward (toward the intersection) depending on the diameter of the wire 60 as compared with the case of FIG. 9A.

If the angle formed by the first wire supporting portion 15a and the second wire supporting portion 16a is set to an obtuse angle greater than 90°, the wire 60 is displaced slightly laterally depending on the diameter of the wire 60 as compared with the case of FIG. 9A.

In the modifications illustrated in FIGS. 9A and 9B, preferably, the bevel 70a of the fastening member 70 is orthogonal to the bisector of an angle formed by the first wire supporting portion 15a and the second wire supporting portion 16a. Since a force pressing the wire 60 is equally applied to the first wire supporting portion 15a and the second wire supporting portion 16a, the wire 60 is hard to move. Thus, stable fastening can be achieved.

Furthermore, in the modifications illustrated in FIGS. 9A and 9B, the fastening member 70 may include a proximal end that serves as a supporting portion and a distal end that serves as a movable portion and has the bevel 70a such that the proximal end is fixed to the arms 11a and 11b, and an elastic member (e.g., a spring) may be disposed between the distal end and the proximal end.

The invention is not limited to the above-described embodiment and modifications and various other modifications may be made. For example, in the above-described embodiment, the sizes and shapes illustrated in the accompanying drawings are not limited, but may be appropriately changed within a range in which the effects of the invention can be achieved. Furthermore, the invention may be appropriately modified and implemented without departing from the spirit and scope of the invention.

For example, the current sensor according to the embodiment may include any magneto-electric transducers configured to output a signal based on an induced magnetic field from target current flowing through a wire. Examples of the magneto-electric transducer include various magnetoresistive elements, such as a giant magnetoresistive (GMR) element and a tunneling magnetoresistive (TMR) element, and various magnetic sensing elements, such as a Hall element.

What is claimed is:

1. A current sensor comprising:
   a casing including a pair of arms and a connecting portion connecting the arms;
   a plurality of magneto-electric transducers accommodated in the casing, the magneto-electric transducers being arranged along a circumference of a virtual ellipse having a first axis and a second axis crossing each other at a center thereof, the first axis being a major axis of the virtual ellipse extending between the arms and coinciding with an intermediate line between the arms, and the second axis being a minor axis of the virtual ellipse, the major axis being longer than the minor axis; and
   a fixing member disposed on the casing, the fixing member being arranged obliquely with respect to the first axis viewed from the center of the virtual ellipse, so as to be closer to one of the arms with respect to the first axis; and
   a band attached to the fixing member, the band winding around a circumferential surface of a current wire disposed between the arms so as to fasten the current wire such that a center of the current wire is pulled toward the fixing member, whereby the center of the current wire is displaced from the center of the virtual ellipse along a direction oblique to the major axis depending on an outer diameter of the current wire.

2. The current sensor according to claim 1, wherein the fixing member and the band hold the current wire such that the center of the current wire is displaced in a first direction if the current wire has a different diameter, wherein a change in sensitivity caused by the displacement in the first direction is relatively smaller than that caused by a displacement of the current wire in a direction along the first axis or the second axis of the virtual ellipse.

3. The current sensor according to claim 2, wherein the fixing member is disposed in a direction angled at 45° from the first axis towards the one of the arms.

4. A current sensor comprising:
   a casing including a pair of arms and a connecting portion connecting the arms;
   a plurality of magneto-electric transducers accommodated in the casing, the magneto-electric transducers being arranged along a circumference of a virtual ellipse having a first axis and a second axis crossing each other at a center thereof, the first axis being a major axis of the virtual ellipse extending between the arms and coinciding with an intermediate line between the arms, and the second axis being a minor axis of the virtual ellipse, the major axis being longer than the minor axis; and
   a fastening member disposed between the arms,
   wherein the casing includes:
      a first wire supporting portion provided on an inner wall of one of the arms; and
      a second wire supporting portion provided on an inner wall of the connecting portion,
   wherein the fastening member has a sloped surface inclined from one of the arms to the other arm, the sloped surface supporting a current wire between the first supporting portion and the second supporting portion,
   and wherein a center of the current wire is displaced from the center of the virtual ellipse along a direction oblique to the major axis depending on an outer diameter of the current wire.

5. The current sensor according to claim 4, wherein the first wire supporting portion, the second wire supporting portion, and the sloped surface fasten the current wire such that the center of the current wire is displaced in a first direction if the current wire has a different diameter, wherein a change in sensitivity caused by the displacement in the first direction is relatively smaller than that caused by a displacement in a direction along the first axis or the second axis of the virtual ellipse.

6. The current sensor according to claim 4, wherein the first wire supporting portion, the second wire supporting portion, and the sloped surface are arranged such that the current wire is pressed in a direction angled at 45° from the first axis towards the one of the arms.

7. The current sensor according to claim 5, wherein the first direction is angled at 45° from the first axis towards the one of the arms.

8. A current sensor comprising:
   a casing including a pair of arms and a connecting portion connecting the arms;
   a plurality of magneto-electric transducers accommodated in the casing, the magneto-electric transducers being arranged along a circumference of a virtual ellipse having a first axis and a second axis crossing each other at a center thereof, the first axis being a major axis of the virtual ellipse extending between the arms and coinciding with an intermediate line between the arms, and the second axis being a minor axis of the virtual ellipse, the major axis being longer than the minor axis; and
   a fixing mechanism configured to hold a current wire between the arms such that a center of the current wire is displaced from the center of the virtual ellipse along a first direction if the current wire has a different diameter, the first direction being angled at a predetermined angle from the first axis toward one of the arms.

9. The current sensor according to claim 8, wherein the fixing mechanism includes:
   a fixing portion disposed on the casing at the first direction viewed from a center of the current wire held between the arms; and
   a cord or strip-like band attached to the fixing portion, the band fastening the current wire to the fixing portion.

10. The current sensor according to claim 8, wherein the fixing mechanism includes:
    a first wire supporting portion provided on an inner wall of one of the arms;
    a second wire supporting portion provided on an inner wall of the connecting portion; and
    a fastening member disposed between the arms, the fastening member having a sloped surface inclined from one of the arms to the other, the sloped surface supporting the current wire between the first supporting portion and the second supporting portion.

11. The current sensor according to claim 8, wherein a change in sensitivity caused by the displacement in the first direction is relatively smaller than that caused by a displacement of the current wire in a direction along the first axis or the second axis of the virtual ellipse.

12. The current sensor according to claim 8, wherein the predetermined angle is about 45°.

13. The current sensor according to claim 1, wherein the virtual ellipse is uniquely defined by the plurality of magneto-electric transducers arranged therealong.

14. The current sensor according to claim 1, wherein a number of the plurality of magneto-electric transducers is eight.

15. The current sensor according to claim 1, wherein the plurality of magneto-electric transducers are not arranged on the major axis of the virtual ellipse.

16. The current sensor according to claim 4, wherein the plurality of magneto-electric transducers are not arranged on the major axis of the virtual ellipse.

17. The current sensor according to claim 8, wherein the plurality of magneto-electric transducers are not arranged on the major axis of the virtual ellipse.

18. The current sensor according to claim 1, wherein the fixing member is disposed in a location on a surface of the casing including an intersection point of the one of the arms and the connecting portion, the intersection point being an intersection of a first virtual line on the surface extending in a direction of the first axis along an inner wall of the one of the arms, and a second virtual line on the surface extending in a direction of the second axis and tangent to a lower surface of the connecting portion.

19. The current sensor according to claim 1, wherein the fixing member includes:
    an abutment surface continuous and flush with an inner wall of the casing, the abutment surface extending from the inner wall in a direction along an axis of the current wire.

* * * * *